United States Patent
Dong et al.

(10) Patent No.: US 9,634,673 B2
(45) Date of Patent: Apr. 25, 2017

(54) ANTI-ISLANDING DETECTION FOR THREE-PHASE DISTRIBUTED GENERATION

(71) Applicant: Virginia Tech Intellectual Properties, Inc., Blacksburg, VA (US)

(72) Inventors: Dong Dong, Schenectady, NY (US); Dushan Boroyevich, Blacksburg, VA (US); Paolo Mattavelli, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 873 days.

(21) Appl. No.: 13/968,487

(22) Filed: Aug. 16, 2013

(65) Prior Publication Data
US 2014/0210282 A1    Jul. 31, 2014

Related U.S. Application Data

(60) Provisional application No. 61/758,381, filed on Jan. 30, 2013.

(51) Int. Cl.
*H03L 7/08* (2006.01)
*H02J 3/38* (2006.01)

(52) U.S. Cl.
CPC ............... *H03L 7/08* (2013.01); *H02J 3/38* (2013.01); *H02J 2003/388* (2013.01)

(58) Field of Classification Search
None
See application file for complete search history.

(56) References Cited

U.S. PATENT DOCUMENTS

| 5,111,377 A * | 5/1992 | Higasa | H02J 3/38 363/131 |
|---|---|---|---|
| 8,203,813 B2 * | 6/2012 | Fujii | H02J 3/18 361/62 |
| 2012/0007436 A1 * | 1/2012 | Yamada | H02J 3/381 307/86 |
| 2012/0013376 A1 * | 1/2012 | Thacker | H03L 7/085 327/156 |

OTHER PUBLICATIONS

Dong Dong, Jin Li, Dushan Boroyevich, Paolo Mattavelli, Yaosuo Xue, "A novel anti-islanding detection algorithm for three-phase distributed generation systems", Feb. 5, 2012, IEEE, 2012 Twenty-Seventh Annual IEEE Applied Power Electronics Converence and Exposition (APEC), pp. 761-768.*

\* cited by examiner

*Primary Examiner* — Rexford Barnie
*Assistant Examiner* — David Shiao
(74) *Attorney, Agent, or Firm* — Whitham, Curtis & Cook, P.C.

(57) ABSTRACT

Wobbling the operating frequency of a phase-locked loop (PLL), preferably by adding a periodic variation is feedback gain or delay in reference signal phase allows the avoidance of any non-detection zone that might occur due to exact synchronization of the phase locked loop operating frequency with a reference signal. If the change in PLL operating frequency is periodic, it can be made of adequate speed variation to accommodate and time requirement for islanding detection or the like when a reference signal being tracked by the PLL is lost. Such wobbling of the PLL operating frequency is preferably achieved by addition a periodic variable gain in a feedback loop and/or adding a periodically varying phase delay in a reference signal and/or PLL output.

15 Claims, 9 Drawing Sheets

ANTI-ISLANDING DETECTION FOR THREE-PHASE DISTRIBUTED GENERATION

CROSS-REFERENCE TO RELATED APPLICATIONS

This application claims benefit of priority of U.S. Provisional Application 61/758,381, filed Jan. 30, 2013, which is hereby incorporated by reference in its entirety. The present invention is also related to U.S. patent application Ser. No. 13/910,371, filed Jun. 5, 2013, Which is also hereby incorporated by reference in its entirety.

FIELD OF THE INVENTION

The present invention generally relates to distributed power generation and distribution systems and, more particularly, to islanding detection for a distributed power generation system and converter.

BACKGROUND OF THE INVENTION

At the present time, electrical power is available to virtually all people in most civilized countries of the world. Consumers of such electrical power are often distributed over a wide geographic area while power generation facilities are generally located in the proximity of either a fuel or energy source (e.g. hydroelectric facilities are often located near where a water reservoir naturally exists or can be economically constructed) or population centers such as cities although nuclear reactors used for power generation are often located somewhat more remotely.

All such power generation facilities inherently have limited power generation capacity although that capacity may be quite large. Many facilities are most efficient when operating continuously near their full power generation capacity while demand for electrical power can be quite variable. At the same time, greater power generation capacity of a given facility may greatly increase the initial capital expenditure required as well as possibly increasing cost of maintenance over the service life of power generation equipment. Therefore, while it is desirable to provide electrical power to consumers located near a power generation facility to limit inefficiency due to power transmission losses and to limit capital expenditures by limiting the power generation capacity of respective facilities to a small excess capacity over anticipated peak demand, it is also desirable to interconnect many such power generation facilities so that excess generated power at a given location can be distributed to locations where demand may, from time-to-time, exceed local power generation capacity. Such interconnection infrastructure is generally referred to as a power grid or, simply, grid and requires that power generation facilities be carefully and precisely synchronized in both frequency and phase so that power can be exchanged between the grid and the local power generation and distribution network.

It is also critical that a connection between local power generation equipment or facility and the grid be maintained, not only to allow frequency and phase information of grid power to be obtained but to avoid excess power being delivered to the grid from being redirected to local loads by a disconnection. Such a disconnection, sometimes referred to as grid loss, can rapidly cause significant damage to local loads and local power converters must be rapidly shut down when a disconnection is detected to prevent or mitigate such damage.

A lack or loss of grid connections is referred to as islanding and the likelihood of disconnection has been aggravated in recent years by the proliferation of relatively small power generation facilities deriving energy from so-called renewable resources such as solar and wind power that may not be consistently available. Such systems usually generate and/or store power as a direct current (DC) voltage and use a controllable converter to derive alternating current (AC) for transmission. Therefore stringent standards have been promulgated for detection of loss of synchronization and disconnection of a local network from the grid.

At the present time, the standard for detection of islanding and providing anti-islanding protection is the IEEE 1547 standard which requires that any distributed power generation facility under 10 MW capacity must be able to detect islanding and de-energize the area electric power system (EPS) within two seconds. The test load specified by the standard is a paralleled RLC (//RLC) load which is resonant at 60 Hz (or the frequency that may be used for the grid) which represents a worst case for islanding detection since such a load presents a near-zero impedance, similar to the impedance of the grid, at the resonant frequency. (An ideal grid would exhibit zero impedance and a grid exhibiting any significant impedance is referred to as a weak grid. The limiting case of grid weakness would be a grid exhibiting infinite impedance and would appear substantially identical to a disconnection from the grid although some voltage or phase information might still be derived.) The standard also requires so-called low-voltage ride-through (LVRT) to accommodate a condition when the grid voltage drops but the grid connection is maintained such that the local power generation facility can and should continue to deliver power to the grid. Islanding detection should also achieve an almost zero non-detection zone (NDZ) such that virtually no islanding condition or event can exist or occur without detection.

Islanding detection arrangements can be either active or passive. Passive islanding detection schemes passively search for disturbances on the grid through sensed and calculated system parameters. The main drawback of passive islanding detection schemes is exhibiting different NDZ regions. In particular, no passive islanding detection arrangement can detect islanding when the load matches the output active power of the converter at the same resonant frequency as the line frequency of the grid.

Among active islanding detection arrangements, output-frequency based islanding detection (OFID) methods that detect changes in frequency and/or phase between the grid and local power generation equipment have been of substantial interest since, in general, they do not violate the LVRT requirement and can provide an almost zero NDZ. Many OFID methods are known that make modifications to the voltage or current control loop of converters and thus are configured to generate so-called frequency positive feedback that will drive the converter system frequency away from the steady state frequency when a reference frequency signal from the grid is not available. However, suitable positive feedback mechanisms and characteristics and design procedures for such methods are not well-developed at the present time and over-design or excessive experimentation have often been required to meet the islanding detection standard. While approaches to islanding detection have recently been the subject of substantial study, few studies have considered the impact of OFIDs on power converter operation, entire system stability or performance of sophisticated power systems such as multi-converter systems. None of the known OFID approaches have, to date, achieved a robust zero NDZ.

SUMMARY OF THE INVENTION

It is therefore an object of the present invention to provide an output frequency islanding detection arrangement that provides an unconditionally zero non-detection zone.

It is another object of the invention to provide an islanding detection method and apparatus capable of reliably distinguishing between islanding events and low grid voltage events.

It is a further object of the invention to provide robust and unconditional islanding detection using a small signal injection that does not require direct injection of a signal onto the grid and which can be achieved simply by peripheral connections to a PLL such that no internal PLL modifications are required.

In order to accomplish these and other objects of the invention, a phase locked loop, a power converter for interfacing a power generation apparatus to a power distribution grid and controlled by a phase locked loop and a power generation apparatus having such a controller are provided wherein the phase locked loop comprises a negative feedback path for causing an operating frequency of said phase-locked loop to track a reference frequency or phase and an arrangement for altering an operating frequency of said phase locked loop.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
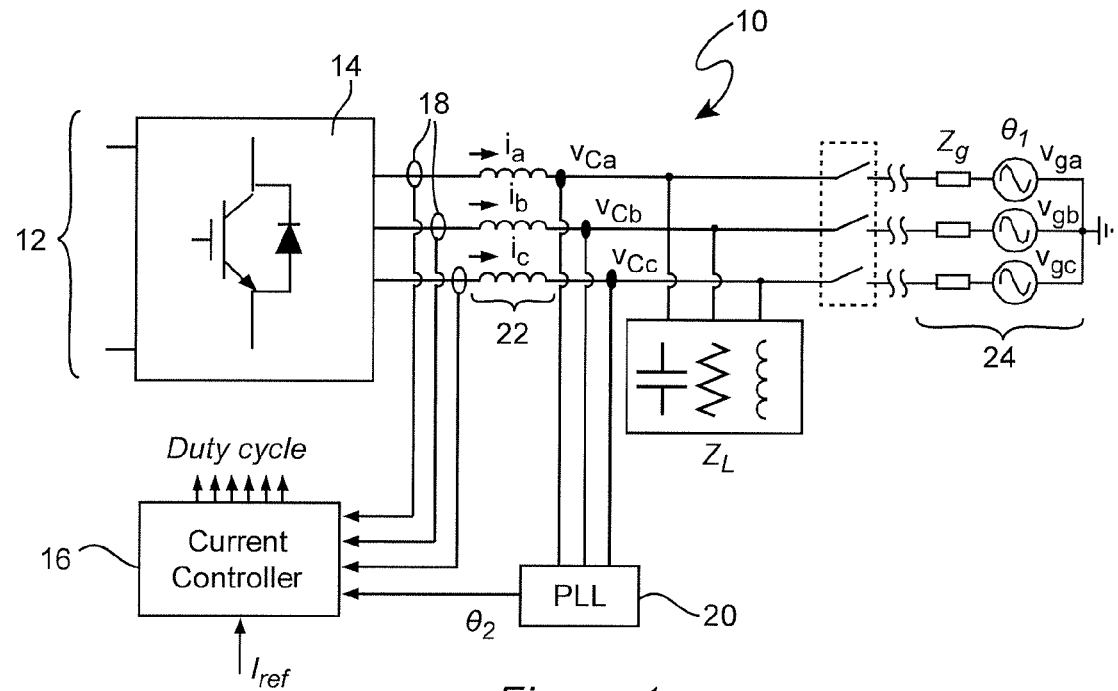
FIG. 1 is a schematic depiction of a three-phase utility interface converter system including a phase-locked loop (PLL)

Referring now to the drawings, and more particularly to FIG. 1, there is shown a schematic representation of a three-phase grid interface PWM converter system 10 to which the invention can be applied and with which the invention has particular utility. It should be understood that other types of power converters can be used and that the power converters can be of any known or foreseeable topology. It should also be understood that FIG. 1 is arranged to illustrate application of the invention to a multi-phase power generation system. Thus, at the level of abstraction of the illustration of FIG. 1, the invention may or may not be illustrated. Therefore, no portion of FIG. 1 is admitted to be prior art in regard to the present invention.

As alluded to above, most smaller power generation systems (e.g. under the 10 MW capacity to which the above standard is applicable) receive power as direct current (DC) at a relatively constant voltage, as depicted by bracket 12 which could be constituted by a current source and filter/storage capacitor or battery. This input power is converted to, for example, three branches of alternating current (AC) power by switches 14 which may be of any suitable configuration such as a pair of series-connected transistors for each phase as illustrated in the above-incorporated U.S. patent application Ser. No. 13/910,371. Pulse width modulation (PWM) control of switches 14 is preferred at the present time since any desired waveform can be generated under digital control in response to current controller 16 responsive to currents in each of the three branches and output of a phase locked loop (PLL) 20 which is, in turn, responsive to the waveforms $v_{Ca}$, $v_{Cb}$ and $v_{Cc}$ after the waveforms have been filtered by inductors 22 in each respective branch or phase.

In FIG. 1, the grid is represented by impedance $Z_g$ and AC voltage generators 24 having a reference phase $\theta_1$. The grid impedance $Z_g$ will be substantially zero when the grid is connected to the interface. When the local power generation facility or apparatus is connected to the grid, $\theta_1$ is available and the converters are synchronized therewith. When the grid is fully disconnected, $Z_g$ is substantially infinite and the change in impedance under such conditions or upon occurrence of an islanding event would be quite easy to detect within a very short time by any OFID technique. However, other conditions can constitute or simulate an islanding event or other event from which recovery is possible and during which the local power generation apparatus should remain connected to the grid and continue to deliver power thereto; the latter being alluded to above as low-voltage ride through (LVRT).

Figure 2:
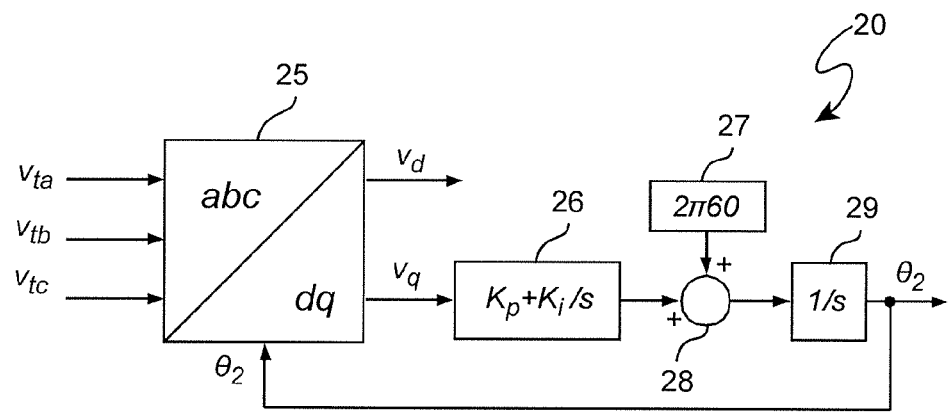
FIG. 2 is a schematic depiction of a synchronous reference frame PLL (SRFPLL)
Figure 3:
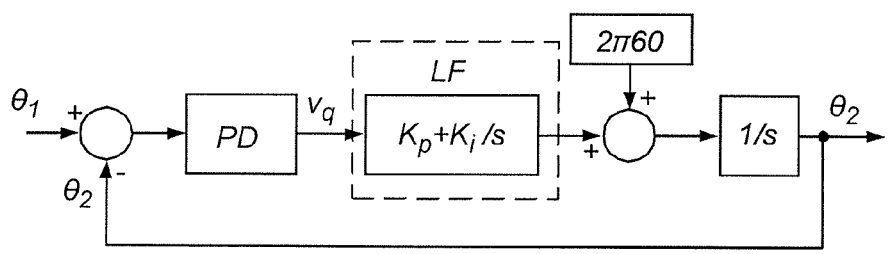
FIG. 3 is a linearized model of the SRFPLL of FIG. 2.

The key element in the interface of FIG. 1 is the phase-locked loop (PLL) 20. A schematic representation of a suitable PLL for a three-phase system is shown in FIGS. 2 and 3. Reference numeral 25 indicates a (preferably digital)

three-phase (abc) to direct and quadrature (dq) converter that produces $v_d$ and $v_q$ signals representing the direct and quadrature components of the three voltage waveforms and their respective phases in accordance with the equations:

$$\begin{bmatrix} v_d \\ v_q \end{bmatrix} = \begin{bmatrix} \cos(\theta_2) & \cos\left(\theta_2 - \frac{2}{3}\pi\right) & \cos\left(\theta_2 + \frac{2}{3}\pi\right) \\ -\sin(\theta_2) & -\sin\left(\theta_2 - \frac{2}{3}\pi\right) & -\sin\left(\theta_2 + \frac{2}{3}\pi\right) \\ \frac{1}{\sqrt{2}} & \frac{1}{\sqrt{2}} & \frac{1}{\sqrt{2}} \end{bmatrix} \begin{bmatrix} v_a \\ v_b \\ v_c \end{bmatrix} \quad (1)$$

$$\begin{bmatrix} v_{ga} \\ v_{gb} \\ v_{gc} \end{bmatrix} = \begin{bmatrix} V_m \sin(\theta_1) \\ V_m \sin\left(\theta_1 - \frac{2}{3}\pi\right) \\ V_m \sin\left(\theta_1 + \frac{2}{3}\pi\right) \end{bmatrix} \quad (2)$$

Thus, the q-channel signal $v_q$ is the phase error signal, which is the output of the phase detector PD, constituted by the abc/dq converter 25. The PD gain can be derived as $$\tilde{v}_q = V_m \sin(\theta_1 - \theta_2) \quad (3)$$
$$\Leftrightarrow PD = \frac{\tilde{v}_q}{\tilde{\theta}}$$
$$= V_m$$

The current loop bandwidth in a PWM grid-interface converter system such as that of FIG. 1 is much larger than the line frequency of the grid (e.g. 60 Hz), and thus can provide accurate line-frequency current regulation. Therefore the converter system can be simply modeled as a current source which precisely follows the current reference in accordance with the equation $$\begin{bmatrix} I_a \\ I_b \\ I_c \end{bmatrix} = \begin{bmatrix} I_{ref} \sin(\theta_2) \\ I_{ref} \sin\left(\theta_2 - \frac{2}{3}\pi\right) \\ I_{ref} \sin\left(\theta_2 + \frac{2}{3}\pi\right) \end{bmatrix} \quad (4)$$

Figure 4:
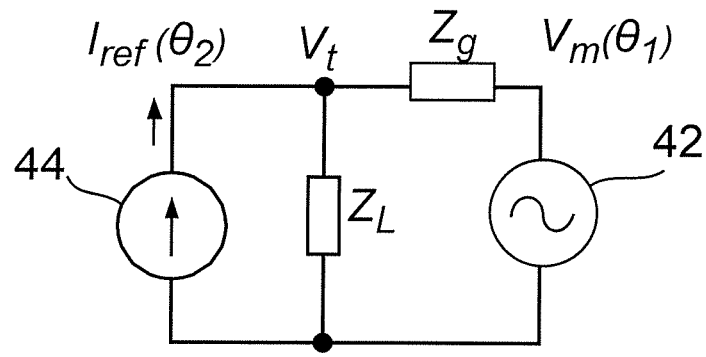
FIG. 4 is a schematic depiction of a one-line equivalent circuit of the converter system of FIG. 1.
Figure 5:
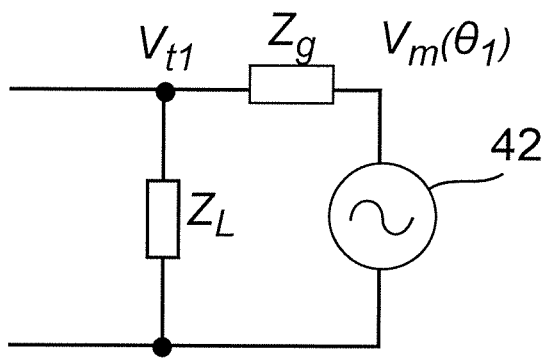
FIG. 5 is a schematic depiction of FIG. 4 considering only the utility grid.
Figure 6:
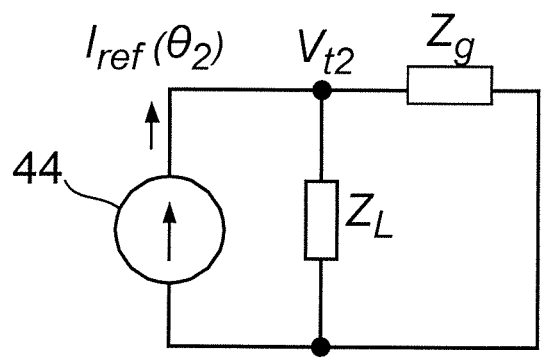
FIG. 6 is a schematic depiction of FIG. 4 considering only the local generator and converter.

The three-phase grid-interface converter system depicted in FIG. 1 can thus be simplified and represented by a one-line circuit as shown in FIG. 4 where $Z_g$ is the equivalent grid input impedance and $Z_L$ is the local load of the converter system. The injected current $I_{ref}$ flows into the system network; generating a voltage response $v_t$ at the terminal of the converter. While the total phase shift or error is a single value, there are contributions to it from both sources: the grid, itself, as a voltage source 42 and the converter as the current source 44. Based on the superposition principle, the impact of the two independent sources 42, 44 can be modeled independently as illustrated in FIGS. 5 and 6, respectively. Thus, the phasor form of $v_t$ in FIG. 4 would be:

$$\vec{v}_t = \vec{v}_{t1} + \vec{v}_{t2} \quad (5)$$
$$= \frac{Z_L}{Z_L + Z_g} \vec{v}_m + \frac{Z_L Z_g}{Z_L + Z_g} \vec{I}_{ref}$$

-continued
$$= \left|\frac{Z_L}{Z_L + Z_g}\right| V_m e^{j(\theta_1 + p_1)} + \left|\frac{Z_L Z_g}{Z_L + Z_g}\right| V_m e^{j(\theta_2 + p_2)}$$

where $p_1$ and $p_2$ are the phase shift angle due to the presence of reactive components in $Z_g$ and $Z_L$ for each respective source 42, 44, respectively, as shown in:

$$\begin{cases} p_1 = \text{phase}\left(\frac{Z_L}{Z_L + Z_g}\right) \\ p_2 = \text{phase}\left(\frac{Z_L Z_g}{Z_L + Z_g}\right) \end{cases} \quad (6)$$

It should be noted that the voltage response due to the switching frequency current ripple is ignored in equation (5) since its amplitude is very small compared to the line-frequency component. That is, the phase detector PD in the PLL only tracks the line-frequency signal and all the other harmonics of, for example, the switching frequency, propagate through the phase detector and low pass filter (LF) and appear as a noise ripple in the output. Thus, it is seen that two frequency components are measured for the PLL to synchronize with $\theta_1$ from the utility/grid and $\theta_2$ from the self-injected current from the converter to reflect the contributions of each of the sources 42 and 44.

Figure 7:
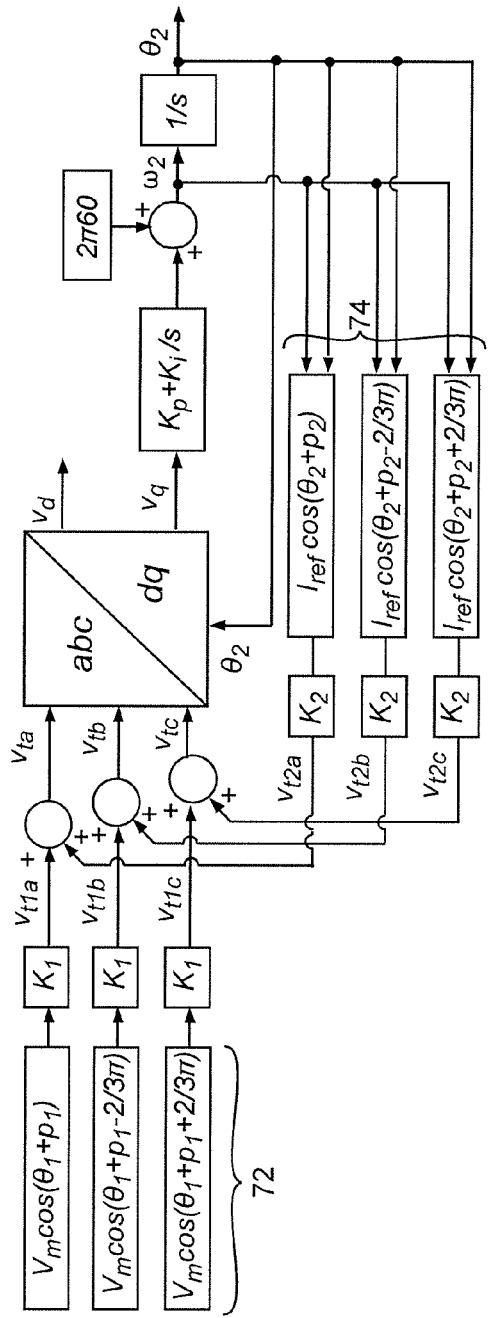
FIG. 7 is a schematic depiction of the PLL system and its operation in accordance with the invention.

Thus, considering the PLL structure in view of the superposition of effects of both the grid and the interface sources, the PLL structure can be depicted as shown in FIG. 7 in which each voltage $v_t$ (e.g. $v_{ta}$, $v_{tb}$, $v_{tc}$) is decoupled into $v_{t1}$ and $v_{t2}$, each having different phase contribution components as shown at 72 and 74. The corresponding gains, $K_1$ and $K_2$ are given by:

$$\begin{cases} K_1 = \left|\frac{Z_L}{Z_L + Z_g}\right| \\ K_2 = \left|\frac{Z_L Z_g}{Z_L + Z_g}\right| \end{cases} \quad (7)$$

Figure 8:
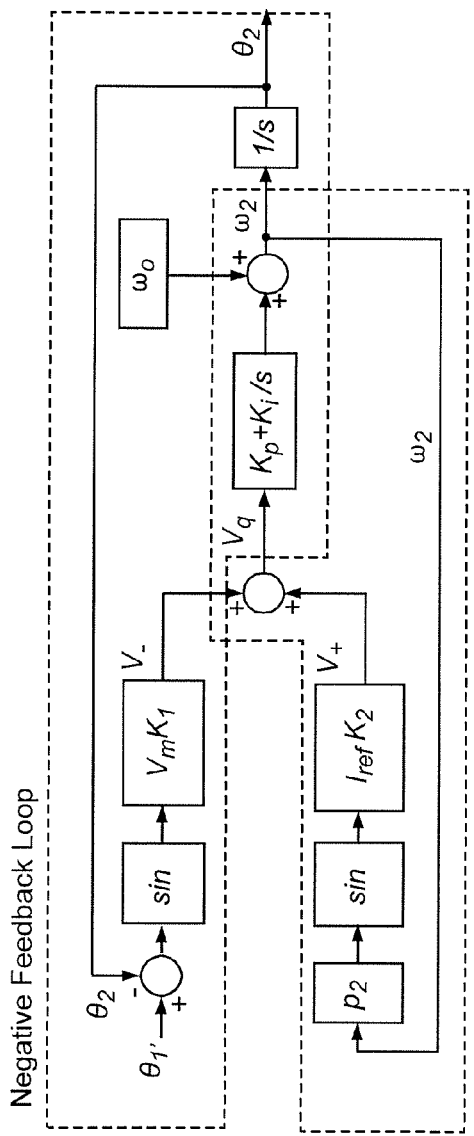
FIG. 8 is a generic model of a PLL in accordance with the invention.

Thus, following the PLL modeling process alluded to above in the conversion of the depiction of FIG. 2 to the depiction of FIG. 3 the generic PLL model shown in FIG. 8 can be derived from FIG. 7 where the input phase would be $$\theta_1' = \theta_1 + p_1. \quad (8)$$

It should be noted that the depiction of the PLL of FIG. 8 includes an upper, negative feedback loop and a lower, positive feedback loop. The effect of the upper, negative feedback loop is dominant when the converter is strongly grid-connected and the converter frequency will accurately track the grid phase information while the effect of the lower, positive feedback loop becomes dominant when the converter is islanded (e.g. the upper feedback loop is effectively disconnected) and will, assuming synchronization is inexact or is perturbed, serve to drive the frequency of the converter away from the line frequency when the reference phase of the grid is not available as disclosed in U.S. patent application Ser. No. 13/910,371, incorporated by reference above. (Both will have some effect when the grid connection is weak, presenting some significant impedance $Z_g$ at the line frequency of the grid.) Thus, by establishing the generic PLL model as shown in FIG. 8, the converter system frequency behavior can be understood and predicted and the islanding detection algorithm (sometimes referred to as an anti-islanding detection algorithm since it serves to protect the grid from islanding of distributed generation (DG) facilities) can be obtained. That the generic PLL model of FIG. 8 is accurate and usable and that suitable islanding detection algorithms can be derived therefrom is rigorously demonstrated in an Appendix to the Provisional patent application incorporated by reference, above.

Figure 9:
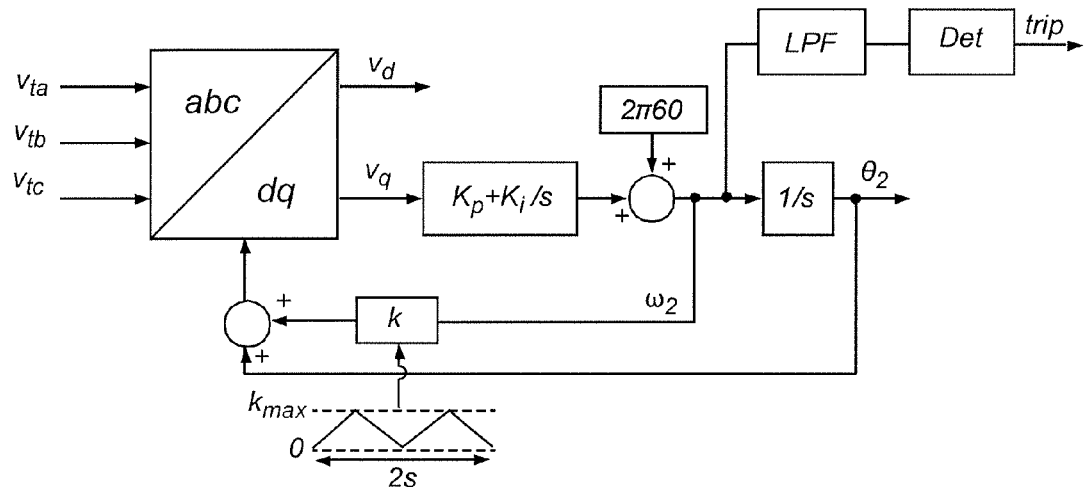
FIG. 9 is a schematic depiction of the PLL system in accordance with a first embodiment of the invention.

Referring now to FIG. 9, a PLL in accordance with a first embodiment of the invention is schematically depicted. Comparing the depiction of FIG. 9 with the PLL depiction of FIG. 2, it is readily seen than an additional feedback term is introduced as a gain, k, which preferably varies as a small, non-critical, low frequency (e.g. 0.5 Hz to 2.0 Hz being preferred and 1.0 Hz being arbitrarily chosen for simulation and testing as will be discussed below) triangular waveform signal. This variable gain, k, constantly shifts the equivalent NDZ point resonant frequency such that the converter and grid frequencies can only be exactly synchronized for a very brief period and guaranteeing that the frequency of the converter will be driven away from the line frequency very promptly and strongly when islanding occurs since there can be no equilibrium point when k varies.

Figure 10:
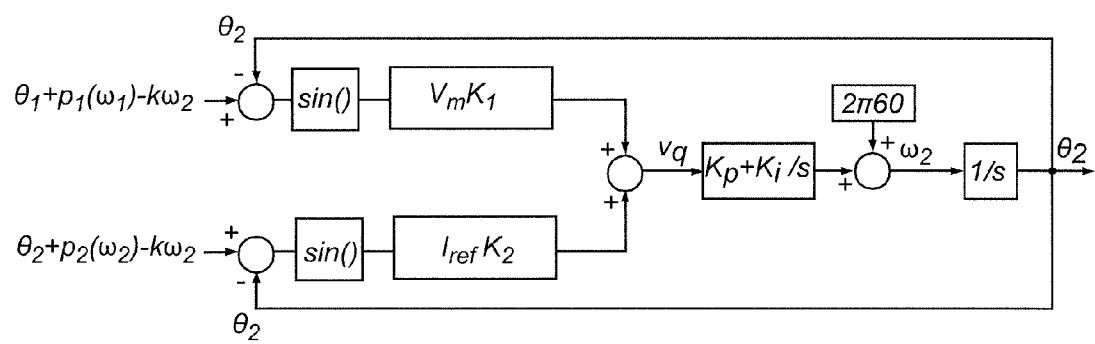
FIG. 10 is a block diagram of a model of the PLL system of FIG. 9.
Figure 11:
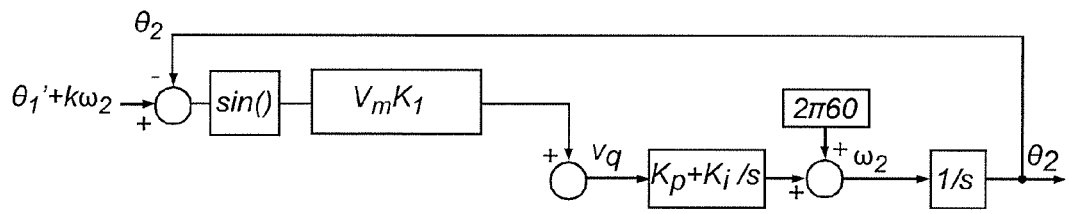
FIG. 11 is a block diagram of the model of FIG. 10 under grid-connected conditions.
Figure 12:
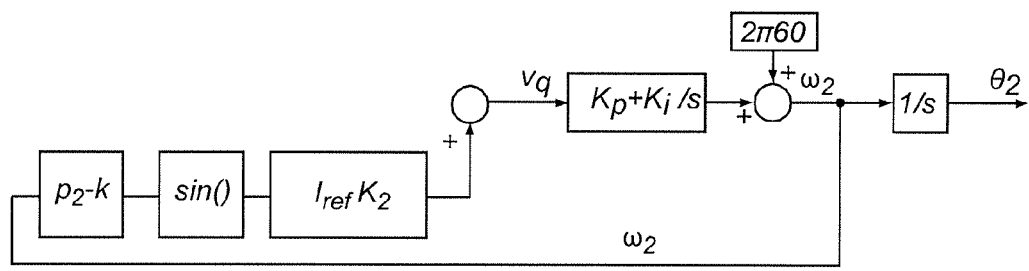
FIG. 12 is a block diagram of the model of FIG. 10 under islanding conditions.

To better understand this function which supports an important meritorious effect of the invention, reference is now made to FIGS. 10-12 and a comparison of FIGS. 9 and 10 to FIGS. 7 and 8 may be helpful, as well. Specifically, the PLL of FIG. 9 can be modeled as illustrated in FIG. 10 in which the upper, negative and lower, positive feedback loops, as discussed above in connection with FIG. 8 are evident. The notation sin( ) shown in the control block represents the sine function" if the input and output of the control block are x and y, respectively, then the relationship is y=sin x. As noted above, when the PLL is grid-connected, the upper, negative feedback loop is dominant (since k is small compared to $\theta_1$ and $p_1$) and the depiction of FIG. 10 reduces to the model illustrated in FIG. 11 which accurately tracks the phase information from the grid. Conversely, in the islanded condition, upper, negative feedback loop effectively vanishes and the converter frequency varies with k (e.g. $p_2$–k); following the variation of the input injection signal.

Figure 13:
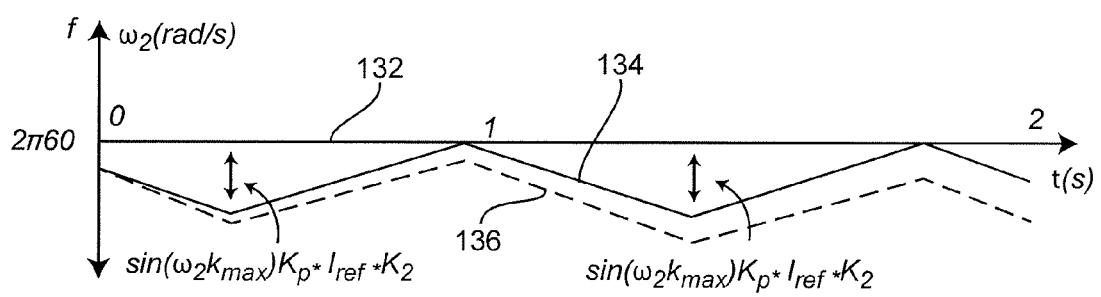
FIG. 13 illustrates PLL output under islanding conditions.

The response of the PLL of FIG. 10 under grid connected and islanded conditions is illustrated in FIG. 13 illustrating PLL frequency as a function of time. If only considering the proportional gain $K_p$ in the PLL, but not the effect of the triangular wave, the output frequency will be constant at $2\pi 60$ rad/sec as shown at 132. If considering only the effects of $K_p$ and the triangular waveform (also sometimes referred to simply as k in reference to the gain shown in FIG. 9) the frequency will vary with k but will not drift over time; returning to $2\pi 60$ when the triangular waveform returns to zero as shown at 134. A larger k will cause more frequency variation and a more sharply anglel frequency waveform. If both $K_p$ and integrator $K_i$ are considered, $K_i$ will allow the varying frequency to drift downward as shown at 136. This frequency variation and drift are effectively a perturbation which will cause the lower, positive feedback loop to drive the converter frequency away from $2\pi 60$ unconditionally and within a very short period after islanding occurs. In FIG. 13, the change in $K_2$ and $p_2$ in terms of $\omega_2$ are not considered since they are generally very small within the first two seconds or cycles of k, especially if the quality factor, Q=R*sqrt(C/L), of the resonant load is very small. If Q is large, the effect of $K_2$ and $p_2$ can be calculated.

Figure 14:
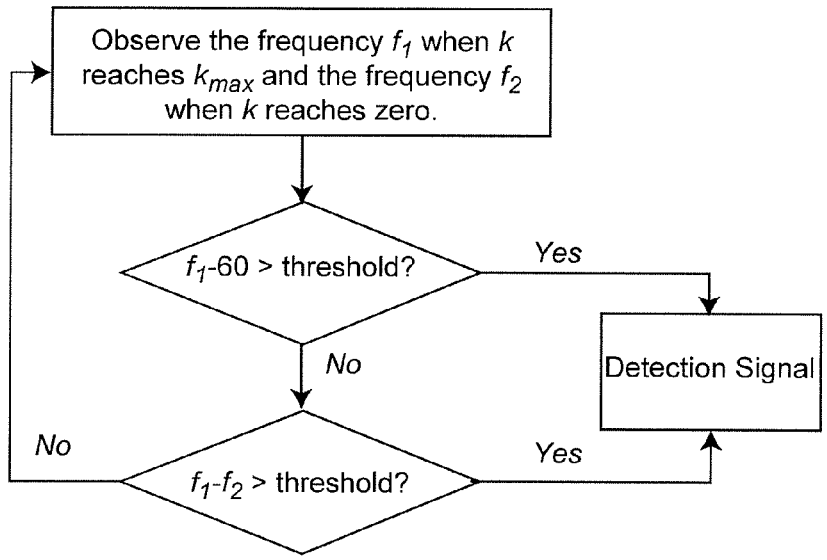
FIG. 14 is a flow chart of islanding condition detection.

It is important to note that the period of the variation of k in FIG. 13 is about 1.0 seconds or less, as is preferred. Under such conditions at least one peak in the frequency will occur within two seconds of an islanding event; the time limit specified in the IEEE standard. Thus the frequency of the PLL output can be monitored and islanding can be reliably detected based on either of two conditions illustrated in FIG. 14. Specifically, when k reaches a maximum, $k_{max}$, the frequency can be compared with 60 Hz and, if the difference is above a threshold, islanding can be determined to have occurred. Similarly, when k reaches $k_{max}$, the frequency can be compared with the frequency when k=0 and if the difference is greater than a threshold (e.g. the frequency variation due to variation in k plus a small tolerance) islanding can also be determined to have occurred.

Figure 15:
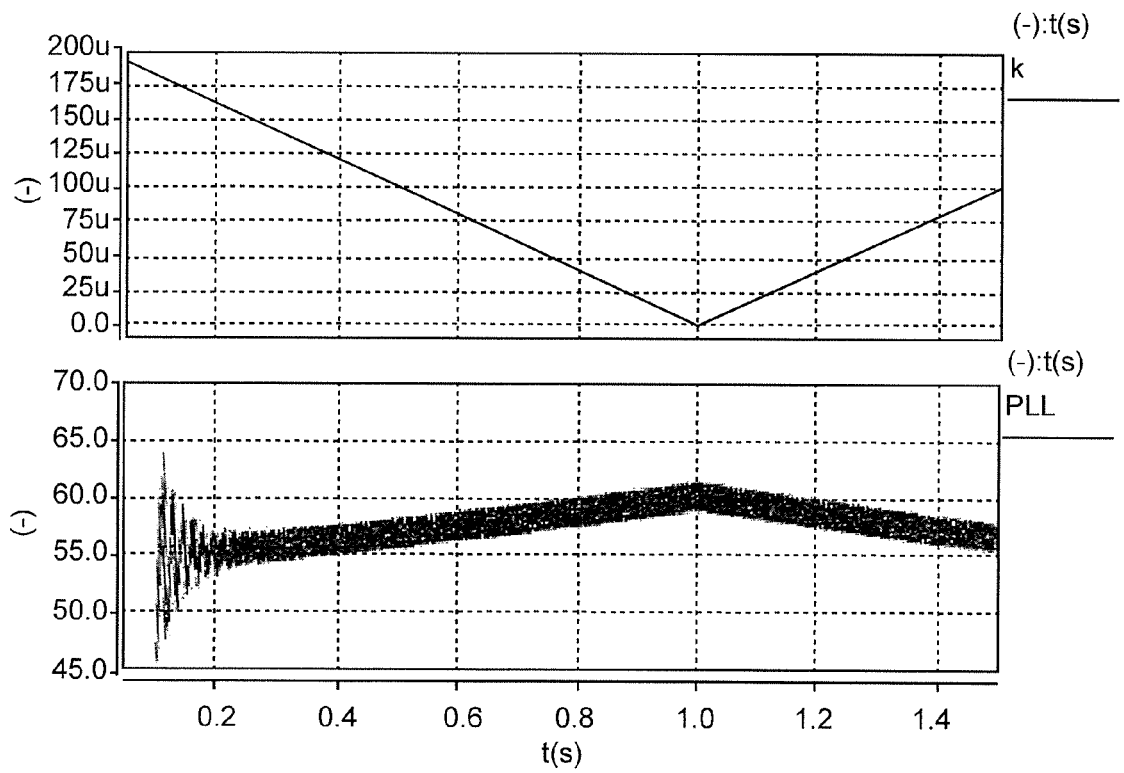
FIGS. 15 and 16 are graphical depictions of simulated PLL output under islanding conditions.
Figure 16:
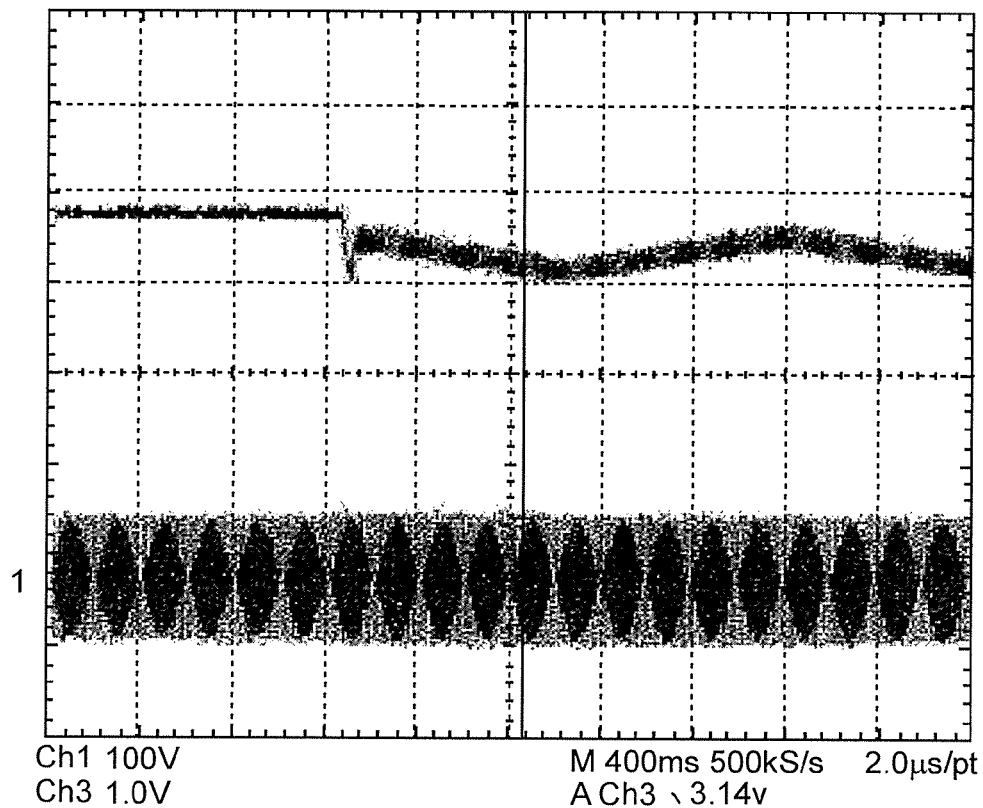

Simulation result for a load of 10Ω+600 µf+11.5 mH is shown in FIG. 15 which indicates that the output frequency of the PLL will follow a small signal k having a peak value of only 200µ (since this is a gain of a control signal, there are no physical units) and thus the islanding condition can be easily detected with only a negligible effect on the PLL when grid connected. The experimental results shown in FIG. 16 agree well with the simulation results with the same //RCL load resonant at 60 Hz.

Figure 17:
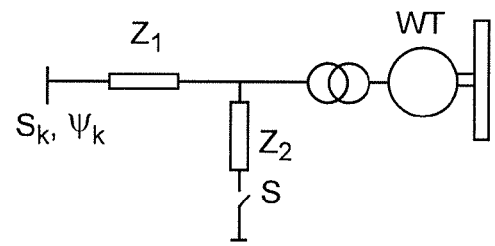
FIG. 17 is a schematic depiction of a test circuit for low voltage ride-through (LVRT) conditions.
Figure 18:
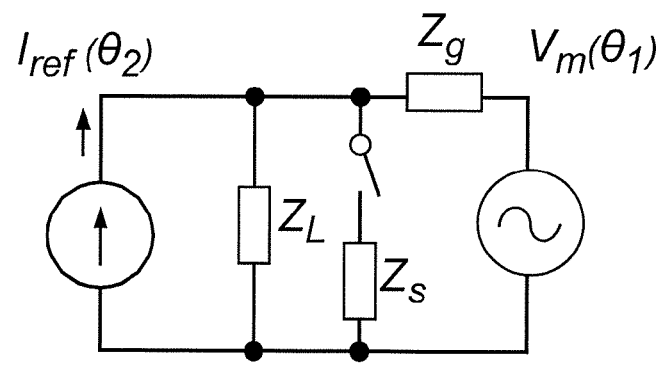
FIG. 18 is a one-line equivalent circuit of LVRT conditions.

The islanding detection technique, PLL and algorithm of the first embodiment can be shown to not violate the LVRT requirements of the IEEE standard. That is, low voltage grid conditions should not be detected as an islanding event. The test circuit for determining if this condition is met is illustrated in FIG. 17, as specified in the IEEE standard. Essentially, this test circuit inserts a switched small shunt impedance, $Z_2$ to simulate the low voltage condition. The corresponding one-line equivalent circuit diagram is illustrated in FIG. 18. Based on the equivalent circuit of FIG. 18, the parameters of the generic PLL model are given by the equations:

$$\begin{cases} K_1 = \left|\dfrac{Z_s // Z_L}{Z_s // Z_L + Z_g}\right| \\ K_2 = \left|\dfrac{(Z_s // Z_L)Z_g}{Z_s // Z_L + Z_g}\right| \end{cases} \quad (9)$$

$$\begin{cases} p_1 = \text{phase}\left[\dfrac{Z_s // Z_L}{Z_s // Z_L + Z_g}\right] \\ p_2 = \text{phase}\left[\dfrac{(Z_s // Z_L)Z_g}{Z_s // Z_L + Z_g}\right] \end{cases} \quad (10)$$

Figure 19:
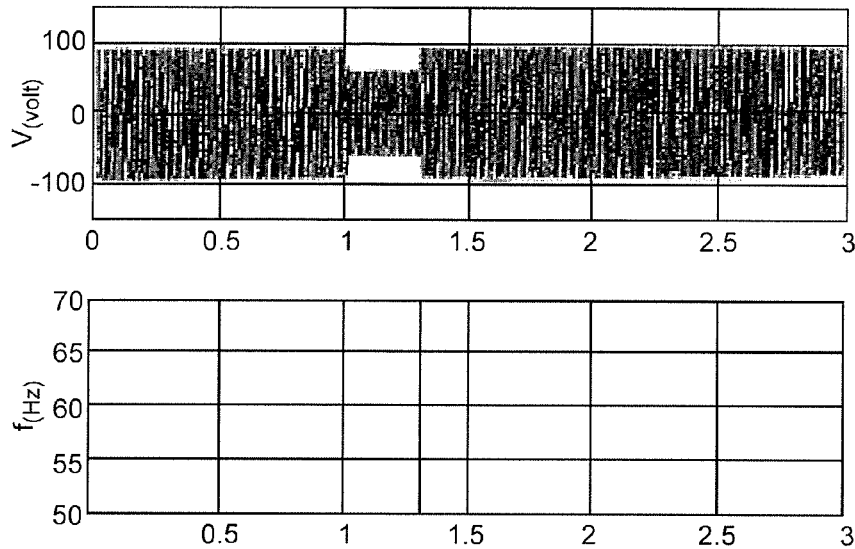
FIG. 19 is a graphical depiction of PLL output under LVRT conditions.

Thus it is seen from equation 10 that the ratio of $K_1$ and $K_2$ does not change under the low voltage condition and there is only a small change in the phase shift term $p_2$. Therefore, if the grid is a reasonably stiff grid with $Z_g$ near zero, low voltage conditions will not be detected as an islanding condition or event. A simulation of low voltage conditions is graphically illustrated in FIG. 19 with $Z_g$ and $Z_s$, shown in FIG. 18 chosen to be 0.56 p.u. (a relatively large value) and 0.056 per unit (p.u.) impedance, only the relative value being important in regard to a power system representing a vary weak grid; a substantially worst case. FIG. 19 shows that the PLL is stable during the low voltage period.

Figure 20:
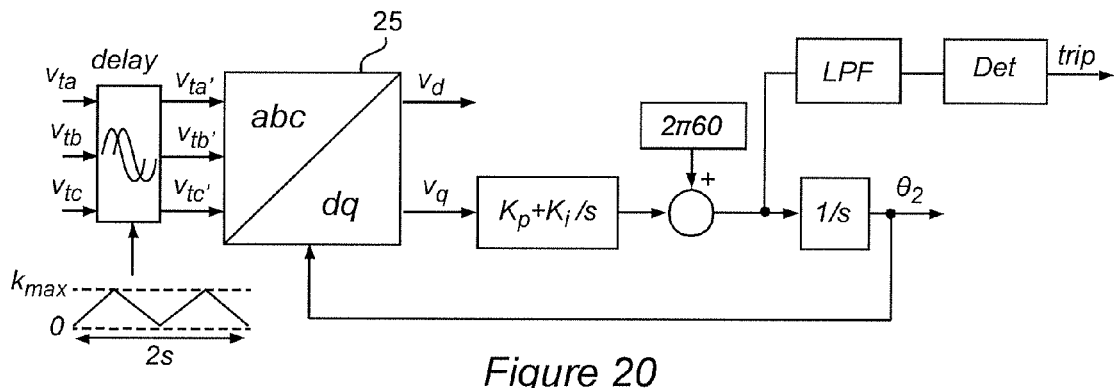
FIG. 20 is a schematic depiction of a PLL in accordance with a second embodiment of the invention.
Figure 21:
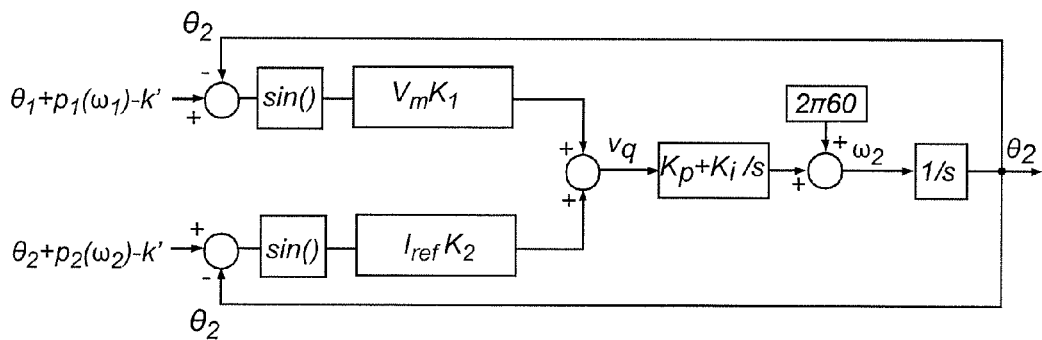
FIG. 21 is a schematic depiction of a model of the PLL of FIG. 20.
Figure 22:
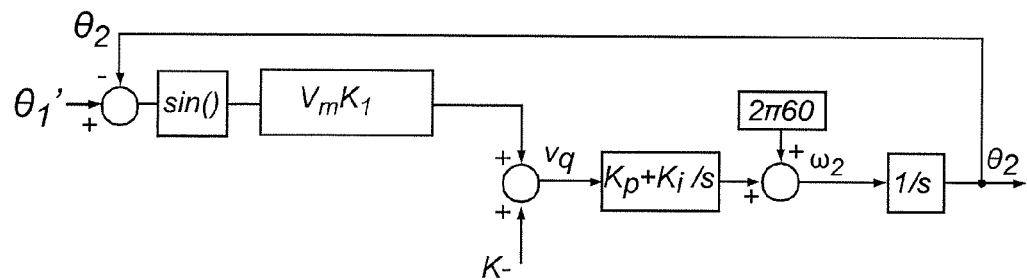
FIG. 22 is a schematic depiction of the model of FIG. 21 under grid-connected conditions.
Figure 23:
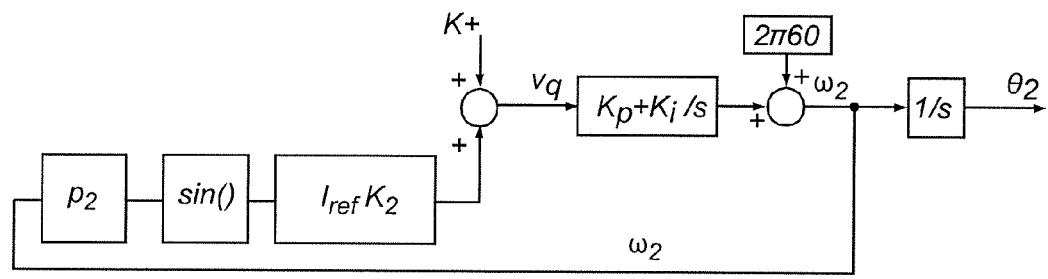
FIG. 23 is a schematic depiction of the model of FIG. 21 under islanding conditions.

Referring now to FIG. 20, a second embodiment of the invention will now be discussed. It will be helpful to compare FIG. 20 with FIG. 9, discussed above. From such a comparison it is readily seen that the second embodiment differs from the first embodiment by omission of the additional feedback path but inserting a variable delay in the $v_t$ inputs to phase detector/abc-dq converter 25. A suitable variable delay can be achieved by any of a number of arrangements that will be apparent to those skilled in the art such as active or passive analog delay circuits or delay lines, active or passive filters, commutating filters, variable sampling rate A/D converters and the like. The delay is preferably varied cyclically in accordance with a triangular waveform k' similar to the preferred triangular waveform having a frequency between 0.5 HZ and 1.0 Hz for variation of k, discussed above. The model of the PLL in accordance with the second embodiment of the invention is shown in FIG. 21, from which it can be seen that the only difference from FIG. 10 is the k/k' term in the reference signal input to the upper and lower feedback loops. The model of FIG. 21 reduces to the models of FIGS. 22 and 23 for the grid-connected and islanded conditions respectively as discussed above in connection with FIGS. 11 and 12. $K_-$ and $K_+$ in FIGS. 22 and 23 are given by the equations:

$$K_- = -\sin(k) \cdot V_m \cdot K_1 \quad (11)$$

$$K_+ = -\sin(k) \cdot I_{ref} \cdot K_2 \quad (12)$$

Therefore, the variation in k' can be seen to constantly shift the resonant NDZ point in substantially the same manner as discussed above for the first embodiment and islanding can be detected under any arbitrary load and synchronization condition. The above analysis of LVRT behavior of the first embodiment of the invention discussed above is equally applicable to the second embodiment of the invention.

Figure 24:
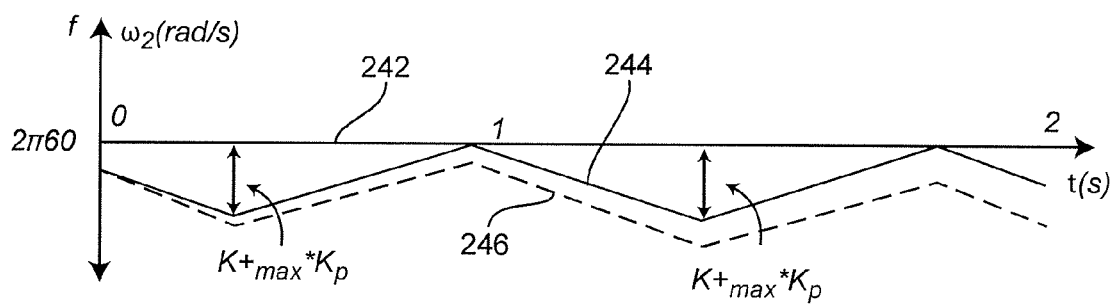
FIG. 24 is a graphical depiction of PLL output of the PLL in accordance with the second embodiment of the invention under islanding conditions.

The behavior of the PLL of the second embodiment of the invention is shown in FIG. 24 and is clearly seen to be completely analogous to that of the first embodiment as discussed above in connection with FIG. 13. That is, if only $K_p$ is considered in the PLL, the frequency of the PLL will be 2π60 rad/sec as indicated at 242. If the integrator $K_i$ is also considered, the PLL frequency will track variations in k' and will drift to zero without reference phase information from the grid. $K_+$ reaches a maximum value $K_{+max}$ when k' reaches a maximum value $k'_{max}$ which will occur at least once in every two seconds if the frequency of k' is chosen to have a value in the preferred range. Thus, it is clearly seen that the PLL frequency behavior and LVRT behavior is substantially identical to that of the first embodiment and the simulation and experimental results are substantially the same as those described above for the first embodiment.

In view of the foregoing, it is clearly seen that the invention essentially "wobbles" the frequency of the PLL so that the non-detection zone is unconditionally reduced to zero even if the PLL and the grid are exactly synchronized at the instant of occurrence of an islanding event. Further, the invention provides for robust distinction of islanding events from low grid voltage events since even for a weak grid and low grid voltage no drift of the PLL frequency will occur. Moreover, the invention provides such "wobbling" of PLL frequency preferably by adding a variable feedback gain term or a variable delay in the grid or PLL output reference information where the frequency of variation is periodic and critical only in regard to meeting the response time requirements of any applicable islanding detection and control standard as may be applied currently or in the future and which can be achieved by essentially non-invasive modifications that may be easily connected to a PLL at the electrical periphery thereof without internal modifications of the PLL and which involve only a small signal that need not be propagated directly onto the grid or detected from perturbations otherwise appearing on the grid. Additionally, while the embodiments for achieving wobbling of the PLL frequency discussed above are very much preferred at the present time, other techniques for periodically varying the PLL frequency will be apparent to those skilled in the art as will be additional applications of the invention to other PLL applications other than islanding detection.

While the invention has been described in terms of two preferred embodiments, those skilled in the art will recognize that the invention can be practiced with modification within the spirit and scope of the appended claims.

Having thus described our invention, what We claim as new and desire to secure by Letters Patent is as follows:

1. A phase-locked loop circuit for controlling an output voltage of a power converter interfacing with a power distribution grid, comprising
    a phase detector configured to receive as an input the output voltage of the power converter;
    a feedback circuit for returning an output frequency or phase signal of the phase-locked loop circuit to the phase detector; and
    a signal alteration circuit configured to either
        add a periodically varying gain signal to the output frequency or phase signal of the phase-locked loop circuit which is returned to the phase detector by the feedback circuit, or
        add a periodically varying phase delay to the output voltage of the power converter that is input to the phase detector;
    wherein the phase-locked loop circuit is configured to provide the output frequency or phase signal to a current controller for adjusting the output voltage of the power converter, and
    wherein the periodically varying gain signal or the periodically varying phase delay is chosen such that when the power converter is connected to the grid, an output frequency of the power converter tracks the grid frequency by negative feedback of a signal in the phase-locked loop circuit and when the power converter is disconnected from the grid the output frequency of the power converter is driven away from the grid frequency by positive feedback of a signal in the phased-lock loop circuit.

2. A phase-locked loop circuit as recited in claim 1, wherein said periodically varying gain signal or said periodically varying phase delay has a triangular waveform.

3. A phase-locked loop circuit as recited in claim 2, wherein said triangular waveform has a frequency in a range from 0.5 Hz to 2.0 Hz.

4. A phase-locked loop circuit as recited in claim 1, wherein said grid frequency is a 60 Hz waveform.

5. A phase-locked loop circuit as recited in claim 1, further including a detector configured to detect drift of an operating frequency.

6. A phase-locked loop circuit for controlling an output voltage of a power converter interfacing with a power distribution grid, comprising
    a phase delay circuit configured to receive an output voltage of the power converter, add a cyclically varying phase delay to the output voltage, and provide the delayed output voltage to a phase detector;
    wherein the phase-locked loop circuit is configured to process a phase error signal from the phase detector and provide an output phase signal to a current controller for adjusting an output frequency of the power converter, the phase-locked loop circuit being configured to feed back the output phase signal to the phase detector to provide phase-locked loop control of the output frequency of the power converter, wherein the cyclically varying phase delay is chosen such that when the power converter is connected to the grid the output frequency of the power converter tracks the grid frequency by negative feedback of a signal in the phase-locked loop circuit and when the power converter is disconnected from the grid the output frequency of the power converter is driven away from the grid frequency by positive feedback of a signal in the phase-locked loop circuit.

7. A phase-locked loop circuit as recited in claim 6, wherein said cyclically varying phase delay varies in accordance with a triangular waveform.

8. A phase-locked loop circuit as recited in claim 7, wherein said triangular waveform has a frequency in a range from 0.5 Hz to 2.0 Hz.

9. A phase-locked loop circuit as recited in claim 6, wherein said grid frequency is a 60 Hz waveform.

10. A phase-locked loop circuit as recited in claim 6, further including a detector configured to detect drift of an operating frequency.

11. A power converter for interfacing a power generation apparatus with a power distribution grid, wherein said power converter includes a phase-locked loop circuit comprising
   a phase detector configured to receive as an input the output voltage of the power converter;
   a feedback circuit for returning an output frequency or phase signal of the phase-locked loop circuit to the phase detector; and
   a signal alteration circuit configured to either
      add a periodically varying gain signal to the output frequency or phase signal of the phase-locked loop circuit which is returned to the phase detector by the feedback circuit, or
      add a periodically varying phase delay to the output voltage of the power converter that is input to the phase detector;
   wherein the phase-locked loop circuit is configured to provide the output frequency or phase signal to a current controller for adjusting the output voltage of the power converter, and
   wherein the periodically varying gain signal or the periodically varying phase delay is chosen such that when the power converter is connected to the grid, an output frequency of the power converter tracks the grid frequency by negative feedback of a signal in the phase-locked loop circuit and when the power converter is disconnected from the grid the output frequency of the power converter is driven away from the grid frequency by positive feedback of a signal in the phased-lock loop circuit.

12. A power converter as recited in claim 11, wherein said periodically varying gain signal or said periodically varying phase delay has a triangular waveform.

13. A power converter as recited in claim 12, wherein said triangular waveform has a frequency in a range from 0.5 Hz to 2.0 Hz.

14. A power converter as recited in claim 11, wherein said-grid frequency is a 60 Hz waveform.

15. A power converter as recited in claim 11, further including a detector configured to detect drift of an operating frequency.

* * * * *